(12) United States Patent
Koyama et al.

(10) Patent No.: US 6,777,273 B1
(45) Date of Patent: Aug. 17, 2004

(54) SEMICONDUCTOR DISPLAY DEVICE

(75) Inventors: Jun Koyama, Kanagawa (JP); Hideto Ohnuma, Kanagawa (JP); Yutaka Shionoiri, Kanagawa (JP); Shou Nagao, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/309,891

(22) Filed: May 11, 1999

(30) Foreign Application Priority Data

| | | |
|---|---|---|
| May 16, 1998 | (JP) | 10-152306 |
| Mar. 8, 1999 | (JP) | 11-059595 |

(51) Int. Cl.[7] .................. H01L 21/00; H01L 21/84
(52) U.S. Cl. ........................ 438/166; 438/473
(58) Field of Search .......... 345/92, 205; 438/151–166, 438/473, 476

(56) References Cited

U.S. PATENT DOCUMENTS

| | | | |
|---|---|---|---|
| 4,127,792 A | * | 11/1978 | Nakata .................... 313/500 |
| 4,510,515 A | * | 4/1985 | Kajita et al. ............... 357/17 |
| 4,952,031 A | * | 8/1990 | Tsunoda et al. ........... 349/24 |
| 5,250,931 A | | 10/1993 | Misawa et al. |
| 5,431,773 A | * | 7/1995 | Ikeda et al. ............... 216/23 |
| 5,529,937 A | | 6/1996 | Zhang et al. |
| 5,594,569 A | | 1/1997 | Konuma et al. .......... 349/122 |
| 5,608,232 A | | 3/1997 | Yamazaki et al. |
| 5,639,698 A | | 6/1997 | Yamazaki et al. |
| 5,700,333 A | | 12/1997 | Yamazaki et al. |
| 5,773,327 A | | 6/1998 | Yamazaki et al. |
| 5,789,284 A | | 8/1998 | Yamazaki et al. |
| 5,814,540 A | | 9/1998 | Takemura et al. |
| 5,869,363 A | | 2/1999 | Yamazaki et al. |
| 5,888,858 A | | 3/1999 | Yamazaki et al. |
| 5,893,730 A | | 4/1999 | Yamazaki et al. |
| 5,897,347 A | | 4/1999 | Yamazaki et al. |
| 5,915,174 A | | 6/1999 | Yamazaki et al. |

(List continued on next page.)

FOREIGN PATENT DOCUMENTS

| | | |
|---|---|---|
| JP | 05-109737 | 4/1993 |

OTHER PUBLICATIONS

Ohtani et al., "LP–B Late–News Poster: A 60–in. HDTV Rear–Projector with Continuous–Grain–Silicon Technology", .1998., pp. 467–470, SID 98 Digest.

Furue et al., "Characteristics and Driving Scheme of Polymer–Stabilized Monostable FLCD Exhibiting Fast Response Time and High Contrast Ratio with Gray–Scale Capability", SID 1998.

Yoshida et al., "A Full–Color Thresholdless Antiferroelectric LCD Exhibiting Wide Viewing Angle with Fast Response Time", 1997 SID Digest, pp. 841–844.

Inui et al., "Thresholdless Antiferroelectricity in Liquid Crystals and its Application to Displays", J. Mater. Chem., 6(4), 1996, pp 671–673.

*Primary Examiner*—Richard Booth
(74) *Attorney, Agent, or Firm*—Eric J. Robinson; Robinson Intellectual Property Law Office, P.C.

(57) ABSTRACT

A small semiconductor display device of low power consumption and with high definition/high resolution/high image quality is provided. The semiconductor display device according to the present invention comprises a pixel matrix circuit, a data line driver circuit and scanning line driver circuits, and these components are formed on the same substrate using a polycrystalline TFT. The fabricating method of the device which includes a process for promoting crystallization by a catalytic element and a process for gettering the catalytic element provides the semiconductor display device with high definition/high resolution/high image quality while it is small in size.

38 Claims, 14 Drawing Sheets

U.S. PATENT DOCUMENTS

| | | | |
|---|---|---|---|
| 5,923,963 A | * 7/1999 | Yamanaka | 438/157 |
| 5,949,115 A | 9/1999 | Yamazaki et al. | |
| 5,956,579 A | 9/1999 | Yamazaki et al. | |
| 5,961,743 A | 10/1999 | Yamazaki et al. | |
| 5,977,559 A | 11/1999 | Zhang et al. | |
| 5,982,348 A | * 11/1999 | Nakajima et al. | 345/92 |
| 5,985,740 A | 11/1999 | Yamazaki et al. | |
| 5,999,155 A | * 12/1999 | Satou | 345/93 |
| 6,027,987 A | 2/2000 | Yamazaki et al. | |
| 6,048,758 A | 4/2000 | Yamazaki et al. | |
| 6,063,654 A | 5/2000 | Ohtani | |
| 6,066,518 A | 5/2000 | Yamazaki | |
| 6,071,764 A | 6/2000 | Zhang et al. | |
| 6,071,766 A | 6/2000 | Yamazaki et al. | |
| 6,072,193 A | 6/2000 | Ohnuma et al. | |
| 6,077,731 A | 6/2000 | Yamazaki et al. | |
| 6,077,758 A | 6/2000 | Zhang et al. | |
| 6,084,247 A | 7/2000 | Yamazaki et al. | |
| 6,087,679 A | 7/2000 | Yamazaki et al. | |
| 6,093,934 A | 7/2000 | Yamazaki et al. | |
| 6,100,562 A | 8/2000 | Yamazaki et al. | |
| 6,108,056 A | * 8/2000 | Nakajima et al. | 349/38 |
| 6,111,557 A | 8/2000 | Koyama et al. | |
| 6,121,660 A | 9/2000 | Yamazaki et al. | |
| 6,133,073 A | 10/2000 | Yamazaki et al. | |
| 6,133,075 A | * 10/2000 | Yamazaki et al. | 438/158 |
| 6,133,119 A | 10/2000 | Yamazaki | |
| 6,153,445 A | * 11/2000 | Yamazaki et al. | 438/158 |
| 6,156,590 A | 12/2000 | Yamazaki et al. | |
| 6,156,628 A | 12/2000 | Ohnuma et al. | |
| 6,160,268 A | 12/2000 | Yamazaki | |
| 6,162,704 A | * 12/2000 | Yamazaki et al. | 438/143 |
| 6,165,824 A | * 12/2000 | Takano et al. | 438/160 |
| 6,168,980 B1 | 1/2001 | Yamazaki et al. | |
| 6,172,671 B1 | * 1/2001 | Shibuya et al. | 345/205 |
| 6,180,439 B1 | 1/2001 | Yamazaki et al. | |
| 6,184,559 B1 | 2/2001 | Hayakawa et al. | |
| 6,194,255 B1 | 2/2001 | Hiroki et al. | |
| 6,197,624 B1 | 3/2001 | Yamazaki | |
| 6,197,626 B1 | * 3/2001 | Yamazaki et al. | 438/159 |
| 6,201,585 B1 | 3/2001 | Takano et al. | |
| 6,204,101 B1 | 3/2001 | Yamazaki et al. | |
| 6,204,154 B1 | 3/2001 | Zhang et al. | |
| 6,207,969 B1 | 3/2001 | Yamazaki | |
| 6,218,219 B1 | 4/2001 | Yamazaki et al. | |
| 6,225,152 B1 | 5/2001 | Yamazaki et al. | |
| 6,232,205 B1 | 5/2001 | Ohtani | |
| 6,232,621 B1 | 5/2001 | Yamazaki et al. | |
| 6,242,290 B1 | 6/2001 | Nakajima et al. | |
| 6,251,712 B1 | 6/2001 | Tanaka et al. | |
| 6,271,818 B1 | * 8/2001 | Yamazaki et al. | 345/92 |
| 6,287,900 B1 | 9/2001 | Yamazaki et al. | |
| 6,291,275 B1 | 9/2001 | Yamazaki et al. | |
| 6,294,441 B1 | 9/2001 | Yamazaki | |
| 6,300,659 B1 | 10/2001 | Zhang et al. | |
| 6,303,415 B1 | 10/2001 | Yamazaki | |
| 6,303,963 B1 | 10/2001 | Ohtani et al. | |
| 6,307,214 B1 | 10/2001 | Ohtani et al. | |
| 6,316,789 B1 | 11/2001 | Yamazaki et al. | |
| 6,316,810 B1 | 11/2001 | Yamazaki et al. | |
| 6,420,246 B1 | * 7/2002 | Yamazaki et al. | 438/149 |
| 6,432,756 B1 | * 8/2002 | Ohtani et al. | 148/DIG. 90 |

* cited by examiner

Shift　　　　Nand　　　　　　　　　　　　Buffer

Resister　　Lever Shifter

SEMICONDUCTOR DISPLAY DEVICE

BACKGROUND OF THE INVENTION

1. Field of the Invention

The present invention relates to a semiconductor display device of active matrix type. More particularly, the present invention relates to a liquid crystal display device of active matrix type which employs liquid crystal as a display medium. Note that in the semiconductor display device according to the present invention, any other display medium (an electroluminescence device, for example) may be used as long as the optical characteristic of the medium is modulated in correspondence with applied voltage.

2. Description of the Related Art

Recently a technique has been rapidly developed which relates to the manufacture of a semiconductor device, such as a thin film transistor (TFT), having a semiconductor-thin film formed on an inexpensive glass substrate. Behind this lies an increasing demand for a liquid crystal display device (liquid crystal panel) of active matrix type.

A liquid crystal panel of active matrix type has a pixel TFT arranged for each of pixel regions consisting of several hundred thousands to several millions of pixels and are arranged in a matrix, (this circuit is called an active matrix circuit), and the TFT controls by means of its switching function an electrical charge that runs in and out of each pixel electrode.

The active matrix circuit is made up of thin film transistors utilizing amorphous silicon formed on a glass substrate.

Also there has been realize d recently a liquid crystal display device of active matrix type in which a quartz substrate is utilized and a thin film transistor is formed of polycrystal silicon film. In this case, a peripheral driver circuit for driving the pixel TFT may also be formed on the same substrate on which an active matrix circuit is formed.

In addition, a technique is known in which a thin film transistor using a crystalline silicon film is formed on a glass substrate by utilization of laser annealing technique or the like. Utilization of this technique makes it possible to integrate on a glass substrate an active matrix circuit with a peripheral circuit.

A large number of notebook type computers in recent years employ liquid crystal display devices of active matrix type. In a personal computer, a liquid crystal display device of multi-gradation is required in cases such as a plurality of software are activated at the same time, and an image from a digital camera is inputted to be processed.

Further, a demand for a liquid crystal display device of active matrix type with small dimensions and high definition/high resolution/high image quality follows on recent growing popularity of portable information terminals, mobile computers, vehicle navigation systems and the like.

When providing a liquid crystal display device of active matrix type with small dimensions and high definition/high resolution/high image quality, it is a matter of significance that the pitch between pixels is made small and how minute the display gradation is made. In order to decrease the pitch between pixels, a pixel TFT has to be reduced in size while meeting difficulties. To carry out fine gradational display, on the other hand, it needs to use a driver circuit of excellent performance, which has not been realized by any circuit in prior art with the sole exception of an external IC circuit.

SUMMARY OF THE INVENTION

The present invention has been made in view of the above, and an object of the present invention is to provide a semiconductor display device, particularly, a liquid crystal display device of active matrix type, with high definition/resolution which may perform excellent gradational display and be reduced in size.

As a structural example of a semiconductor display device according to the present invention, a semiconductor display device shown below may be included.

According to an aspect of the present invention, there is provided a semiconductor display device comprising:

an active matrix circuit having a plurality of pixel TFTs arranged in a matrix; and a data line driver circuit and scanning line driver circuits each having a plurality of TFTs, for driving the active matrix circuit, wherein each of active layers of the plurality of pixel TFTs and of the plurality of TFTs of the data line driver circuit and the scanning line driver circuit is crystallized by a catalytic element, and wherein the catalytic element is selectively gettered on the catalytic element with a gettering element. Then the above object can be attained.

For the catalytic element, one or plural kinds of elements selected from the group consisting of Ni, Fe, Co, Ru, Rh, Pd, Os, Ir, Pt, Cu and Au may be used.

For the gettering catalytic element, alternatively, one or plural kinds of elements selected from the group consisting of Ge, Pb, In and Sn may be used.

As the element for gettering, phosphorus (P) may be used.

Also, as the gettering element, one or plural kinds of elements selected from the group consisting of P, N, As, Sb and Bi may be used.

In the data line driver circuit, a shift resister may have the maximum operating frequency shown in FIG. 9 or 10. For example, each of the TFTs of the data line driver circuit has a maximum operating frequency of 16 MHz with a channel length 4 $\mu$m, and of 1 GHz with a channel length of 1.5 $\mu$m.

In the above semiconductor display device, the gettering element may be activated by irradiation of laser light or irradiation of intense light.

BRIEF DESCRIPTION OF THE DRAWINGS

FIG. 10 is a graph showing an operational characteristic of a shift resister in the liquid crystal display device of active matrix type according to Embodiment 1 of the semiconductor display device of the present invention;

DESCRIPTION OF THE PREFERRED EMBODIMENTS

The present invention regarding to a semiconductor display device will be described through embodiments below. Incidentally, the semiconductor display device according to the present invention is not limited to the following embodiments.

Embodiment 1

Figure 1:
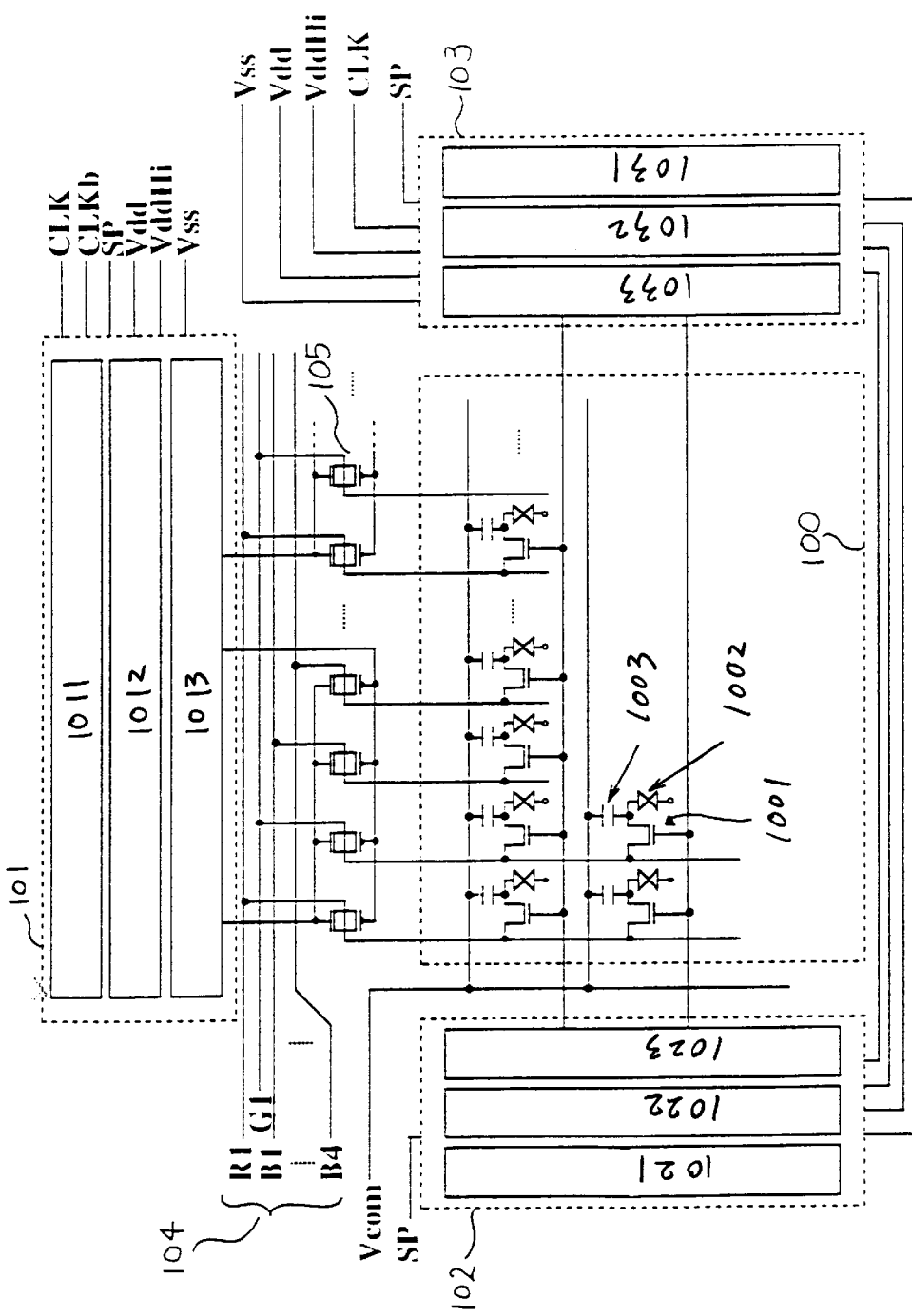
FIG. 1 is a block diagram showing a liquid crystal display device of active matrix type according to Embodiment 1 of a semiconductor display device of the present invention.

FIG. 1 is a block diagram showing a liquid crystal display device of active matrix type according to this embodiment, which is a semiconductor display device of the present invention.

In FIG. 1, reference numeral 100 denotes an active matrix circuit in which pixels each consisting of a pixel TFT 1001, a liquid crystal 1002 and an auxiliary capacitance 1003 are arranged in a matrix. Here, the liquid crystal display device of active matrix type according to this embodiment has a resolution of 1920×480 pixels (640 ordinate×RGB ×480 abscissa) and corresponds to the VGA standard. Incidentally, R represents a pixel corresponding to a red image, G, a green image and B, a blue image. It should be noted that the number of the pixels is not limited to the above.

Reference numeral 101 denotes a data line driver circuit. The data line driver circuit 101 has a shift resister 1011, a level shifter 1012 and a buffer 1013. As for signals to be inputted to the data line driver circuit 101, as shown in FIG. 1, CLK (clock), CLKb (inverted clock), SP (start pulse), Vdd (+2V power supply), VddH (+8V power supply) and Vss (−8V power supply) are included.

Reference numeral 102 denotes a left hand scanning line driver circuit, and 103 denotes a right hand scanning line driver circuit. The scanning line driver circuits 102 and 103 have the identical structure to each other, and both of them receive the same signals. This is employed with the intention of eliminating stagnation of scanning signals by simultaneously driving the scanning lines with both of the left and the right circuits, and, as well, of taking precautions against such a case that either the left circuit or the right circuit would not operate. The scanning line driver circuit 102 has a shift resister 1021, a level shifter 1022 and a buffer 1023. The scanning line driver circuit 103 has a shift resister 1031, a level shifter 1032 and a buffer 1033. As for signals to be inputted to the left hand scanning line driver circuit 102 and the right hand scanning line driver circuit 103, CLK (clock), SP (start pulse), Vdd (+2V power supply), VddH (+8V power supply) and Vss (−8V power supply) are included.

On the basis of a timing signal from the data line driver circuit, a video signal from a video input signal line is applied to a pixel. In this embodiment, the video input signal line consists of R, G and B each having four lines. This is because serial video data, in this embodiment, is divided into four pieces at an external dividing circuit to be converted into four pieces of parallel image data. Though video data is divided into four in this embodiment, video data may be divided unrestrictedly into numbers other than four. For instance, if serial video data is divided into n (n represents an integer equal to or larger than 2), the video input signal line consists of R, G and B each having n lines (3n lines, in total).

In this embodiment, dividing of video data is performed with the dividing circuit provided at the outside. The circuit may alternatively be formed on the same substrate on which the active matrix circuit 100, the data line driver circuit 101, the left hand scanning line driver circuit 102 and the right hand scanning line driver circuit 103 are formed.

Figure 2:
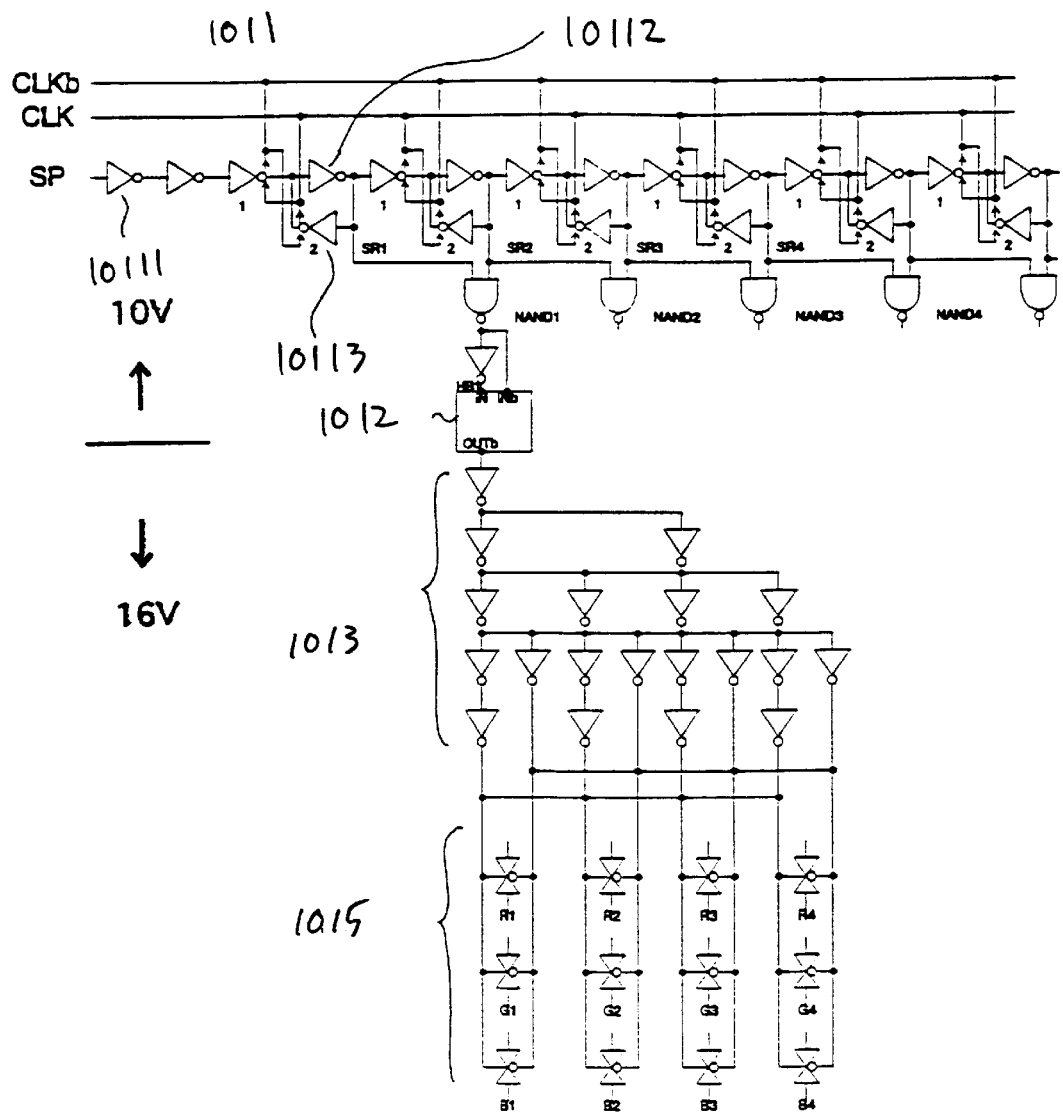
FIG. 2 is a circuit diagram of a data line driver circuit in the liquid crystal display device of active matrix type according to Embodiment 1 of the semiconductor display device of the present invention.

Next, reference will be made to FIG. 2. FIG. 2 is a circuit diagram showing the data line driver circuit 101 according to this embodiment of the present invention. The shift resister 1011, as shown in FIG. 2, has as its components an SR 1, an SR 2, ... and an SR 160. Each of the components has an inverter 10112 and a clocked inverter 10113. Reference numeral 10111 denotes an inverter for buffering a start pulse.

A timing signal supplied from each of the components SR 1, SR 2, ... and SR 160 of the shift resister 1011 is supplied to the level shifter 1012 through NAND circuit (NAND 1, NAND 2, ... and NAND 160). The timing signal to be inputted to and outputted from the NAND circuit and the shift resister 1011 is 10 V, which is increased to 16 V by the level shifter 1012.

The timing signal, voltage level of which is increased by the level shifter 1012 to 16 V, is then buffered by the buffer 1013 to operate an analog switch 1015. The analog switch 1015 is operated with the timing signal from the buffer 1015 to supply video signal from a video input signal line 104 (not shown) to the pixel TFT of each pixel. In this embodiment, the video signal is simultaneously supplied (to drive) into each set of four data lines for R, G and B with the timing signal supplied from the NAND circuit. This results from that serial video data is divided by the external dividing circuit into four pieces of parallel video data. In FIG. 2, R1 to R4, G1 to G4 and B1 to B4 represent the data line numbers respectively corresponding to the color R, G and B. The present embodiment uses, as understood from the above description, 640 data lines for each R, G and B.

Incidentally, when video data is divided into n parts as mentioned above, the video signal is simultaneously supplied to n data lines for each R, G and B by the timing signal supplied from the NAND circuit.

The circuit structure of the scanning line driver circuit, though not particularly explained, is not so different from that of the data line driver circuit except that the scanning line driver circuit is not provided with any analog switch and has a low driving frequency.

An example of fabricating method for a liquid crystal display device of active matrix type according to this embodiment of the present invention will next be described. Note that the fabricating method to be described below is merely a means for embodying the liquid crystal display device of active matrix type according to the present invention, and other fabricating method may be competent for realizing the liquid crystal display device of active matrix type of the present invention.

Reference is made to FIGS. 3A to 3D. First, a glass substrate 301 of 12.5 cm/square is prepared (Corning 1737 glass substrate, for instance). On this glass substrate 301, a silicon oxide film 302 is formed 200 nm in thickness through plasma CVD method using TEOS as a raw material. Needless to say, the film may be formed in required thickness. The silicon oxide film 302 has a function of an under layer to prevent impurities on the substrate side from diffusing into semiconductor films.

Figure 3A:
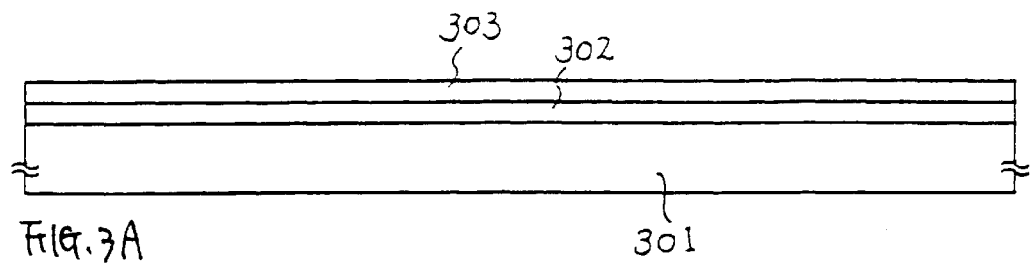
FIGS. 3A to 3D are views showing steps in one fabricating method of the liquid crystal display device of active matrix type according to Embodiment 1 of the semiconductor display device of the present invention.

Film formation of an amorphous silicon film 303 is next carried out with plasma CVD method (FIG. 3A). Though used here is plasma CVD method, a low pressure CVD may also be used. The amorphous silicon film 303 is 550 Å in thickness. The thickness may be changed into required value, of course. Then a thin oxide film (not shown) is formed through irradiating UV light onto the surface of the amorphous silicon film 303.

Figure 3B:
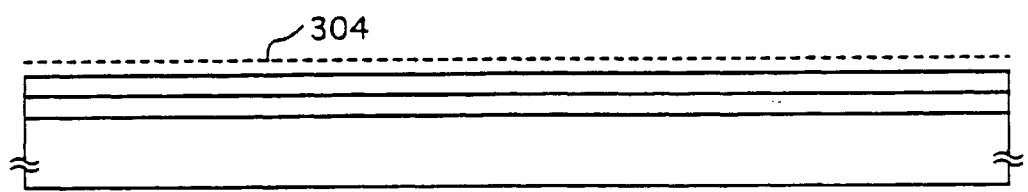

Next, liquid phase Ni (nickel) acetate 304 is applied onto the surface of the amorphous silicon film 303 by spin coating method. The above thin oxide film is provided to uniformly apply the Ni acetate 304 on the film surface. Ni element functions as a catalytic element for promoting crystallization when the amorphous silicon film is crystallized (FIG. 3B).

Figure 3C:
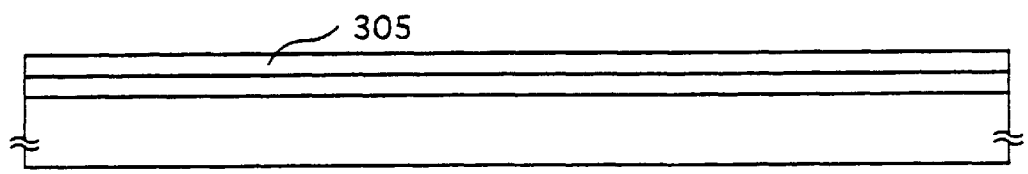

Then, the amorphous silicon film is held to be dehydrogenated in a nitrogen atmosphere at a temperature of 450 to 500° C. (500° C., in this embodiment) for an hour. This aims at forming intentionally dangling bonds in the amorphous silicon film to reduce the thershold energy at subsequent crystallization. And then the amorphous silicon film is crystallized by applying a heat treatment in an nitrogen atmosphere at the temperature range of 550 to 600° C. (550° C., in this embodiment) for 4 to 8 hours (four hours, in this embodiment). That crystallization temperature as low as 550° C. is realized by the action of nickel element. Nickel element moves in the silicon film, during the above heat treatment, while promoting the crystallization of the silicon film. Thus, a polycrystalline silicon film 305 can be formed with a temperature not exceeding 600° C. on the glass substrate (FIG. 3C). The polycrystalline silicon film is further annealed by laser to enhance its crystallinity.

At the above crystallization and/or enhancement of crystallinity, RTA may be used. RTA is an abbreviation for Rapid Thermal Annealing. In RTA, a light source, typical example of which is a halogen lamp, of intense light mainly emits infrared light to heat only the film formed on the surface of the substrate in a short period of time. RTA will be described in detail in Embodiment 3.

In the above process, nickel is applied onto the entire surface of the amorphous silicon film. Alternatively, nickel may be selectively added to the amorphous silicon film using a mask, or the like, to have crystals grow. In that case, crystals grow mainly in a lateral direction.

For the catalytic element, one or plural kinds of elements selected from the group consisting of Ni, Fe, Co, Ru, Rh, Pd, Os, Ir, Pt, Cu and Au may be used.

Also, for the catalytic element, one or plural kinds of elements selected from the group consisting of Ge, Pb, In and Sn may be used.

Figure 3D:
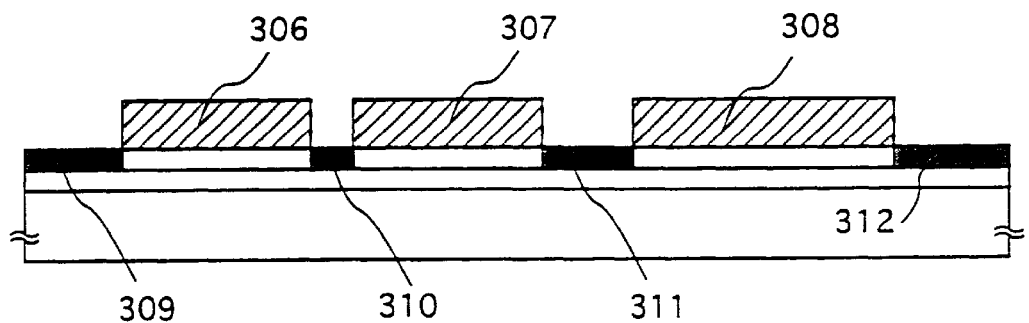

Then, the process proceeds to a step of removing nickel in the film. Firstly, masks 306 to 308 formed of oxide films are formed in thickness of 100 nm to 130 nm (130 nm, in this embodiment). The masks are arranged to selectively carry out doping with phosphorus (P). When this state is acquired, phosphorus doping is conducted. Through that, phosphorus is doped defining to regions 309 to 312 of the polycrystalline silicon film 305 which are not covered with the masks 306 to 308 (and which will be called phosphorus added regions) (FIG. 3D). At this time, acceleration voltage of doping and the thickness of each mask formed of oxide film are optimized so that phosphorus does not substantially pierce through the masks 306 to 308. The masks 306 to 308 are not necessarily formed of oxide films. Still, the oxide film is convenient, for it does not cause contamination even when it contacts directly with an active layer.

Proper dose of phosphorus is found to be about $1\times10^{14}$ to $1\times10^{15}$ ions/cm$^2$. In this embodiment, doping is carried out in a dose of $5\times10^{14}$ ions/cm$^2$ with an ion doping device.

Incidentally, the acceleration voltage at the time of ion doping is set to 10 kV. With the acceleration voltage of 10 kV, it is almost impossible for phosphorus to pierce through the oxide film mask having a thickness of 100 nm.

Figure 4A:
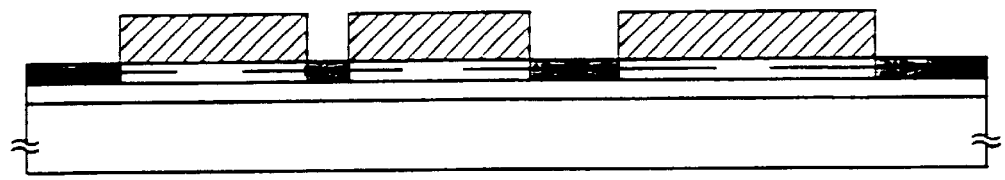
FIGS. 4A to 4D are views showing steps in the fabricating method of the liquid crystal display device of active matrix type according to Embodiment 1 of the semiconductor display device of the present invention.

Thereafter, nickel element is gettered through thermal annealing under a nitrogen atmosphere at a temperature of 600° C. for 1 to 12 hours (12 hours, in this embodiment) (FIG. 4A). This causes nickel to be drawn by phosphorus, so that substantially no nickel is remained in the phosphorus added regions 309 to 312. In other words, phosphorus functions as a gettering element. Under the temperature of 600° C., while phosphorus atoms hardly move in the film, nickel atom can move about several 100 $\mu$m long or more. Understood from this is that phosphorus is one of the most suitable elements for gettering of nickel.

Figure 4B:
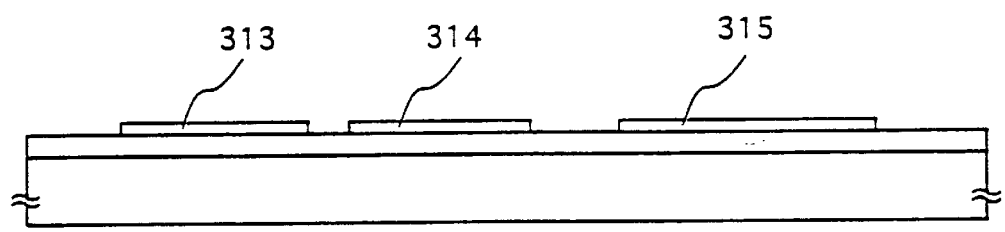

Next, the polycrystalline silicon film 305 is patterned. It is required at this time to take care that the phosphorus added regions 309 to 312, namely, regions in which gettering of nickel has been performed are not remained. In this way, polycrystalline silicon films 313 to 315 containing almost no nickel element are obtained (FIG. 4B). The obtained polycrystalline silicon films later becomes active layers of TFTs.

As the gettering element, one or plural kinds of elements selected from the group consisting of P, N, As, Sb and Bi may also be used.

Figure 4C:
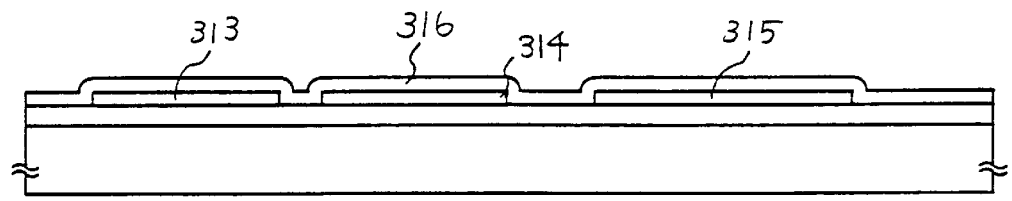

A gate insulating film 316 is next formed. In this embodiment, a silicon oxide film (SiO$_2$) is formed as the gate insulating film 316 in a thickness of 150 nm through plasma CVD method (FIG. 4C).

Figure 4D:
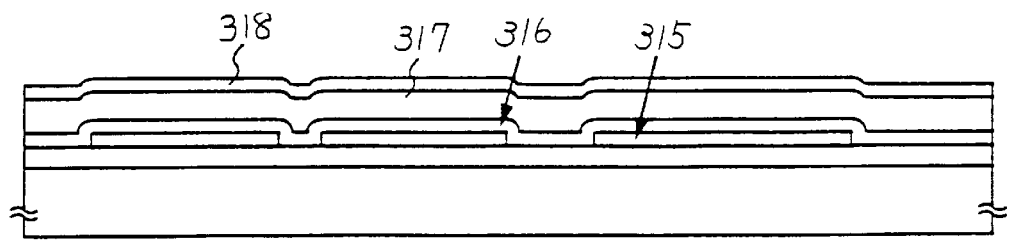

Subsequently, a metal film, not shown, containing aluminum as its main ingredient is formed. This embodiment employs an aluminum film containing scandium of 2 wt% (FIG. 4D).

On a surface where the metal film is exposed, an anodic oxide film 318 is formed using anodic oxidation method. Denoted by reference numeral 317 is a portion of the metal film, where the anodic oxidation is not conducted(FIG. 4D).

Figure 5A:
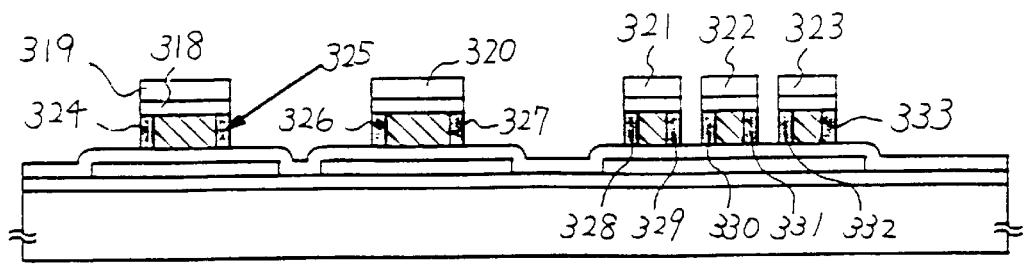
FIGS. 5A to 5D are views showing steps in the fabricating method of the liquid crystal display device of active matrix type according to Embodiment 1 of the semiconductor display device of the present invention.

Resists 319 to 323 are then formed on the top of the anodic oxide film. The anodic oxide film 318 and the metal film 317 are patterned to form the originals of gate electrodes. With a known anodic oxidation technique, porous anodic oxide films 324 to 333 are formed (FIG. 5A).

Figure 5B:
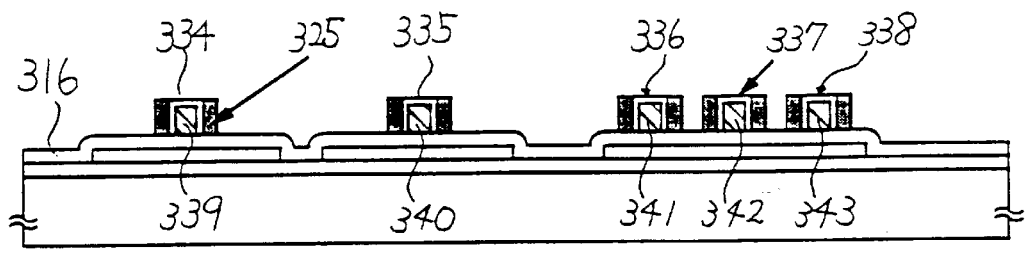

Further, non-porous anodic oxide films 334 to 338 and gate electrodes 339 to 343 are formed by a known anodic oxidation technique (FIG. 5B).

Figure 5C:
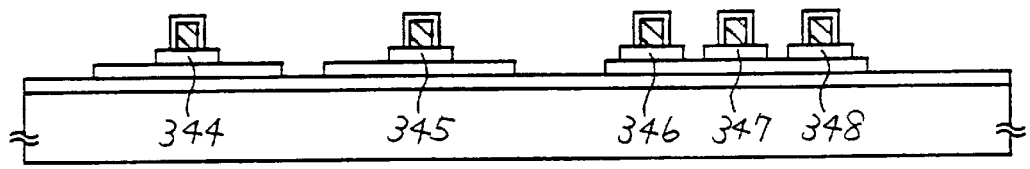

The gate insulating film 316 is etched using as the masks the gate electrodes 339 to 343 and the porous anodic oxide films 324 to 333. Then the porous anodic oxide films 324 to 333 is removed to obtain the state shown in FIG. 5C. In FIG. 5C, reference numerals 344 to 348 denote the gate insulating films after processing.

Comes next a step of adding impurities for giving one conductivity. As impurity elements, P (phosphorus) or As (arsenic) may be used for N channel type, and B (boron) or Ga (gallium) may be used for P channel type.

Addition of impurities comprising two steps, in this embodiment, will be performed to form N channel type TFTs and to form P channel type TFTs, respectively.

First, addition of impurities for forming the N channel type TFT is carried out. The first impurity addition (in this embodiment, P (phosphorus) is used) is conducted with a high acceleration voltage of about 90 kV to form an n⁻ region. The n⁻ region is adjusted to have a P ion concentration of $1 \times 10^{18}$ atoms/cm³ to $1 \times 10^{19}$ atoms/cm³.

The second impurity addition is further conducted with a low acceleration voltage of about 10 kV to form an n⁺ region. This time, the gate insulating film functions as a mask because of low acceleration voltage. The n⁺ region is adjusted to have a sheet resistance of 500Ω or less (preferably, 300Ω or less).

Subsequently, covering the N channel TFT, a resist mask (not shown) is provided. Then, impurity ions which give the P type are added.

This process is also comprised of two steps, as the above process of impurity addition, but requires addition of B (boron) ions with a concentration of several times as high as the above addition concentration of P so that N channel type is inverted to P channel type.

Figure 5D:
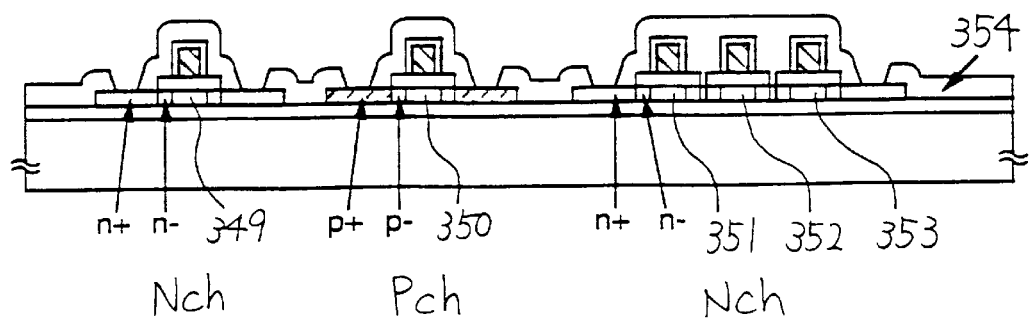

In this way, active layers of the N channel type TFT and the P channel type TFT are formed (FIG. 5D). Incidentally, regions denoted by reference numerals 349 to 353 are to be channel forming regions.

After the active layers are thus completed, impurity ions are activated through a combination of methods such as furnace annealing, laser annealing and lamp annealing. Simultaneously with that, damages of the active layers caused at the addition step are repaired.

Figure 6A:
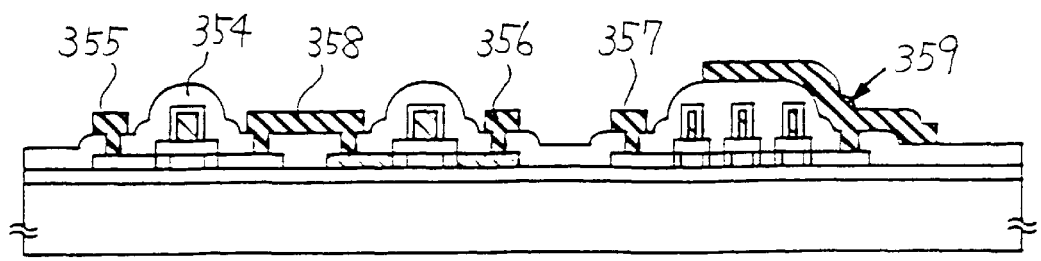
FIGS. 6A to 6C are views showing steps in the fabricating method of the liquid crystal display device of active matrix type according to Embodiment 1 of the semiconductor display device of the present invention.

Next, a laminated film comprising a silicon nitride film (with a thickness of 250Å) and a silicon oxide film (with a thickness of 9000 Å) are formed as an interlayer insulating film 354, and also are formed contact holes. Thereafter, source electrodes 355 to 357 and drain electrodes 358 and 359 are formed using a metal film that has three layers of Ti/Al/Ti. A state shown in FIG. 6A is thus obtained. As the interlayer insulating film 354 an organic resin film may also be used.

A first interlayer insulating film 360 is then formed of an organic resin film with a thickness of 0.5 to 3 μm. In this embodiment, the first interlayer insulating film is formed of polyimide. As the organic resin film, polyimide, acryl, polyimideamide or the like is used. The organic resin film has advantages examples of which include a simple film formation method, easiness in increasing the film thickness, reducible parasitic capacitance owing to its low relative permittivity and superior flatness. Some organic resin films other than the above may also be used.

A black mask 361 comprising a film having a light shielding property is next formed 200 nm in thickness on the first interlayer insulating film 360. The black mask 361 is formed using a titanium film in this embodiment. Alternatively, a resin film containing black pigment may be used.

When titanium is used for the black mask 361, a part of wirings in driver circuits and other peripheral circuits can be formed using titanium. The titanium wirings can be formed simultaneously with the formation of the black mask 361.

Upon completion of forming the black mask 361, a polyimide film is formed as a second interlayer insulating film 362. Instead of polyimide or other organic resin films, either silicon oxide film or silicon nitride film, or a laminated film comprising both films may be formed in a thickness of 0.1 μm to 0.3 μm. Contact holes are formed through the first interlayer insulating film 360 and the second interlayer insulating film 362 to form a pixel electrode 363 having a thickness of 120 nm. This embodiment takes up an example relating to an active matrix liquid crystal display device of transmission type, and hence transparent conductive film such as ITO is used for a conductive film constituting the pixel electrode 363 (FIG. 6B).

The entire substrate is then heated in a hydrogen atmosphere at 350° C. for 1 to 2 hours to hydrogenate the whole device, thereby compensating dangling bonds in the films (in the active layers, in particular). Through the above process, a CMOS circuit and a pixel TFT each comprised of N channel TFTs and P channel TFTs are formed on the same substrate. Thus fabricated is an active matrix substrate, of a liquid crystal display device of active matrix type according to this embodiment. Incidentally as shown in the drawing, the pixel TFT has in this embodiment the triple gate electrode-structure. With this, OFF current of the pixel TFT can be reduced.

Now, description will be made of a process for fabricating a liquid crystal display device of active matrix type using the active matrix substrate fabricated by the above process.

Figure 6B:
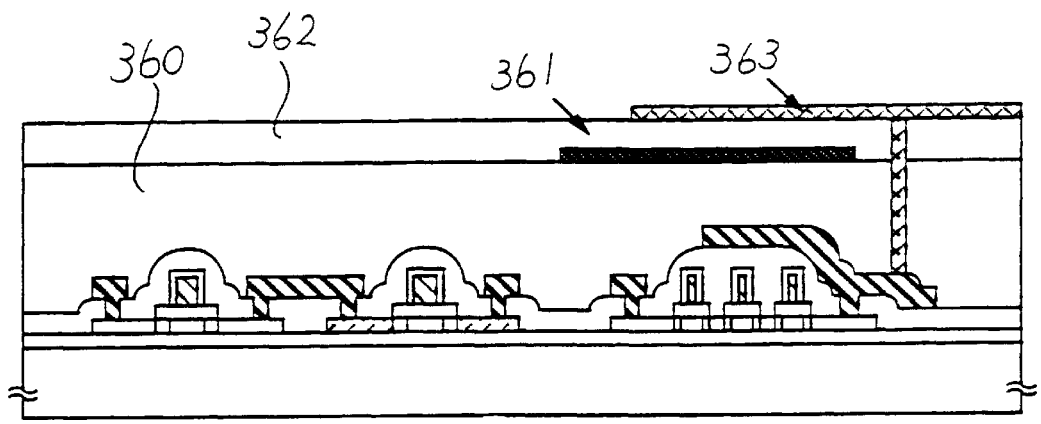

On the active matrix substrate in the state shown in FIG. 6B, an orientation film 364 is formed. In this embodiment, polyimide is used for the orientation film 364. An opposite substrate is next prepared. The opposite substrate comprises a glass substrate 365, a transparent conductive film 366 and another orientation film 364.

In this embodiment, a polyimide film is used as the orientation film, which makes it possible for liquid crystal molecules to be oriented in parallel with the substrate. After the orientation film is formed, rubbing treatment is applied so that liquid crystal molecules are oriented, with a certain pre-tilt angle, in parallel.

Figure 6C:
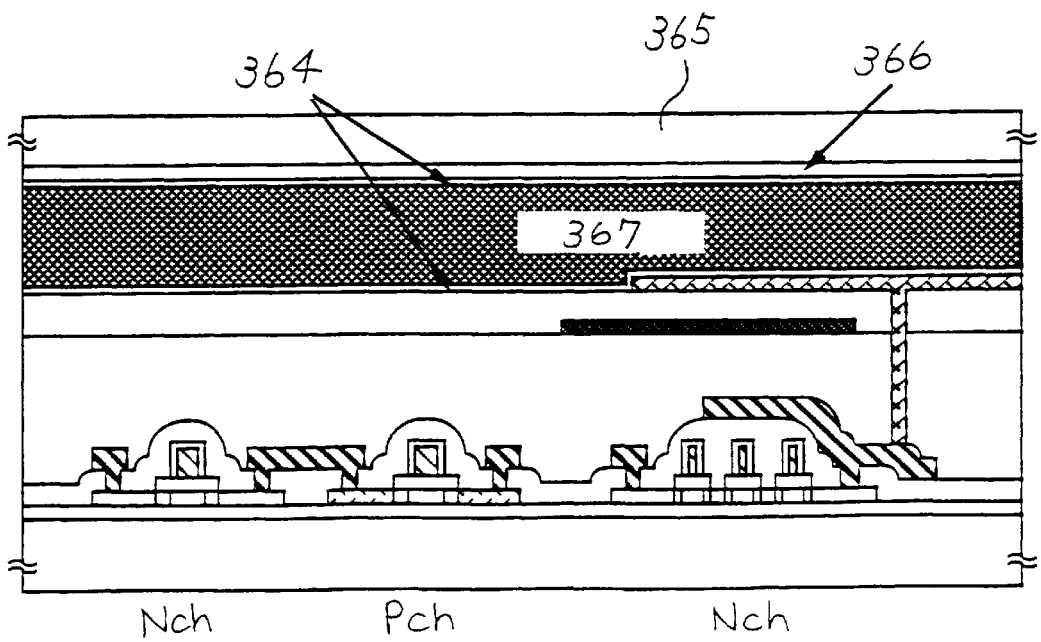

The active matrix substrate having passed through the above process and the opposite substrate are then pasted together through a sealing material, a spacer (both of them are not shown) or the like by a known process for assembling cells. Thereafter, liquid crystal 366 is filled into a space between the two substrates, and an end-sealing material (not shown) completely seals the device. Thus completed is a transmission type liquid crystal display device of active matrix type shown in FIG. 6C.

Incidentally, the liquid crystal panel displays, in this embodiment, on the basis of TN (Twist Nematic) mode. The liquid crystal display device of active matrix type is therefore held in cross Nicol (a state in which polarization axes of a pair of polarizing plates are at right angles with each other) between a pair of polarizing plates.

Figure 7:
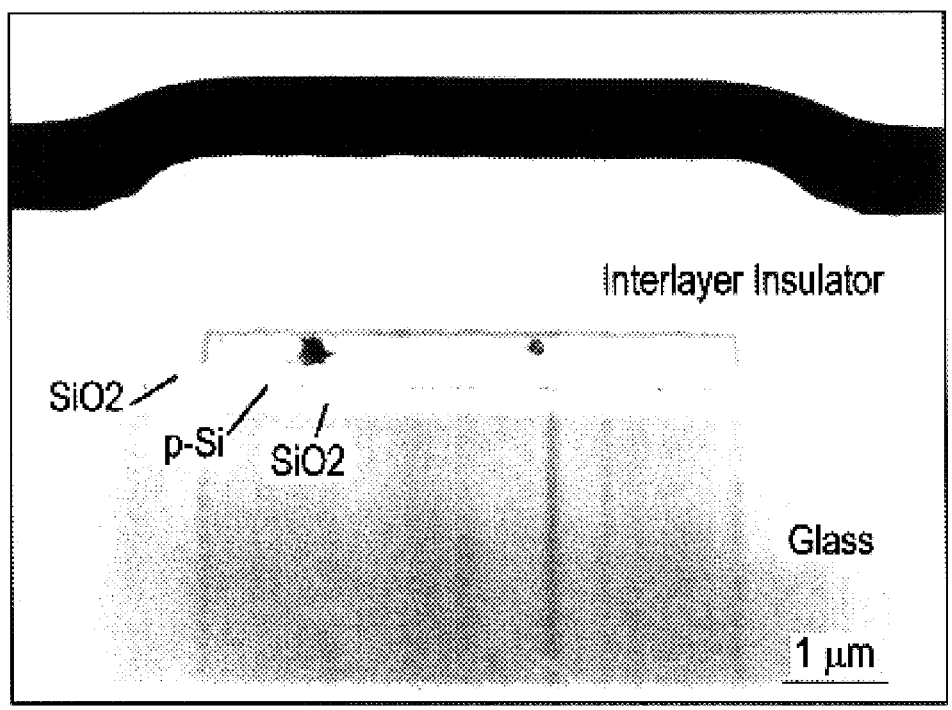
FIG. 7 is a sectional view of a TFT constituting the liquid crystal display device of active matrix type according to Embodiment 1 of the semiconductor display device of the present invention.

Shown in FIG. 7 is an SEM photograph of a TFT obtained by the fabricating method according to the present embodiment.

Figure 8:
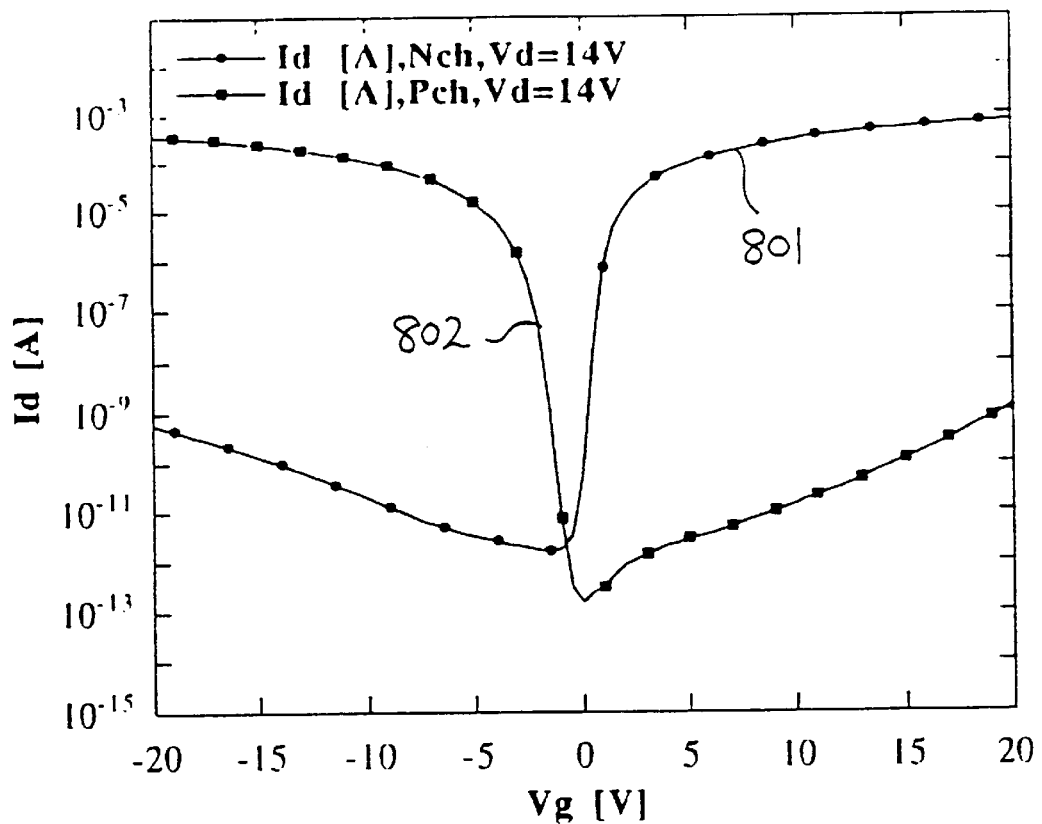
FIG. 8 is a graph showing a characteristic of the TFT constituting the liquid crystal display device of active matrix type according to Embodiment 1 of the semiconductor display device of the present invention.

Next, a characteristic of the TFT obtained by the fabricating method according to the present embodiment will be illustrated with reference to FIG. 8. Expressed in FIG. 8 is the Id-Vg curve (drain current-gate voltage curve) of the TFT obtained by the fabricating method according to the present embodiment. The curve 801 shows a characteristic of the N channel type TFT, and the curve 802 shows a characteristic of the P channel type TFT.

Both the TFTs, the N channel type TFT and the P channel type TFT, exhibit a characteristic that the threshold value is small. Also in Table 1 below, each characteristic of the N channel type TFT and the P channel type TFT is shown.

TABLE 1

|  |  | nch | pch |
|---|---|---|---|
| Ion | (uA) | 287 | 107 |
| Ioff | (pA) | 2.9 | 2.35 |
| Vth | (V) | 0.68 | −2.2 |
| S | (V/dec) | 0.266 | 0.3 |
| $\mu$ | (cm2/Vs) | 260 | 124 |
| L/W | (um) | 6/8 | 6/8 |
| LDD | (um) | 0.75 | 0.75 |
| Offset | (nm) | 85 | 85 |
| GI | (nm) | 150 | 150 |

In Table 1, Ion denotes ON current; Ioff, OFF current; Vth, threshold voltage; S, S value; $\mu$, mobility; L/W, channel length/channel width; LDD, lightly doped region ($n^-$ or $p^-$ region); GI, thickness of gate insulating film.

Figure 9:
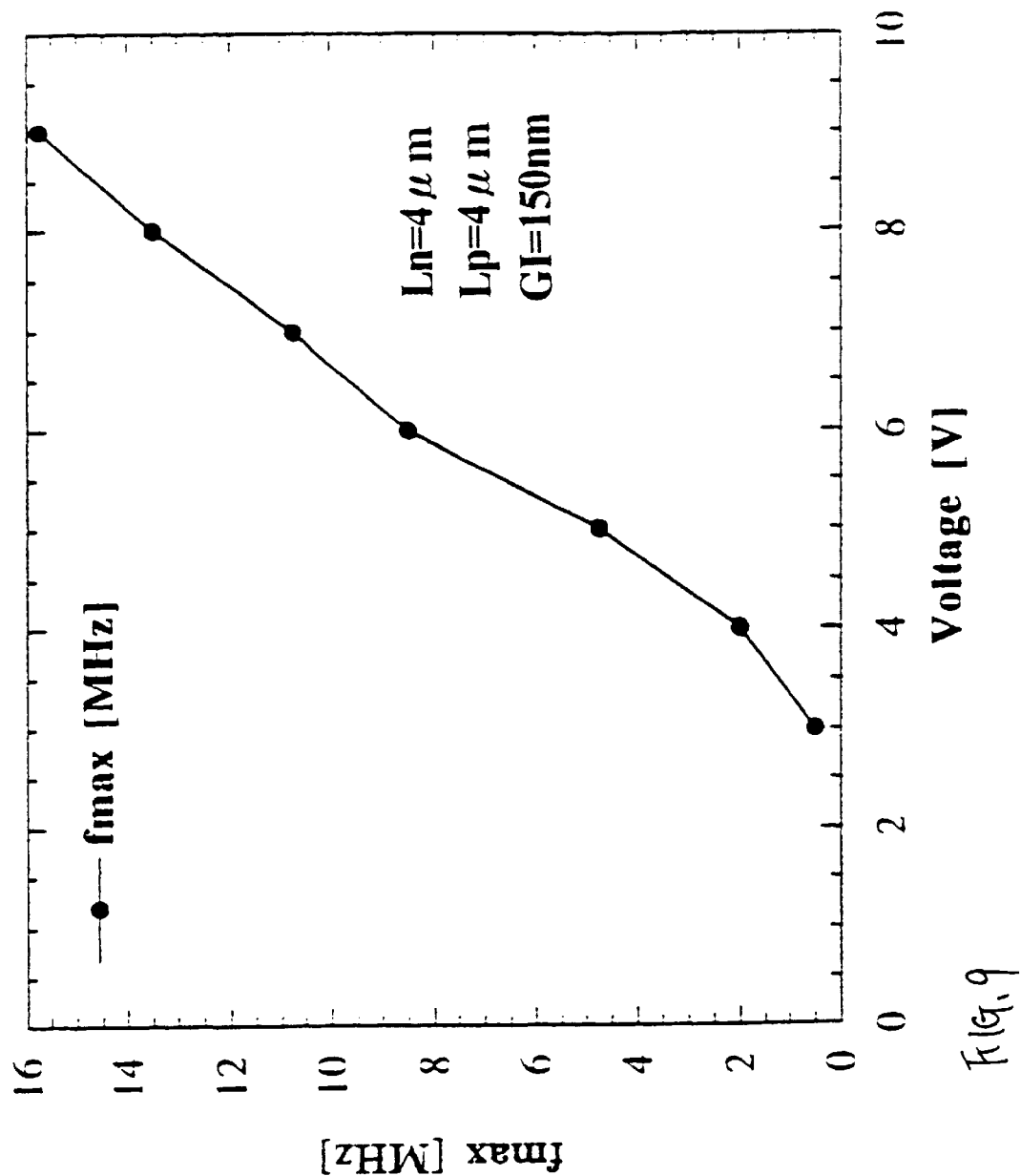
FIG. 9 is a graph showing an operational characteristic of a shift resister in the liquid crystal display device of active matrix type according to Embodiment 1 of the semiconductor display device of the present invention.
Figure 6:
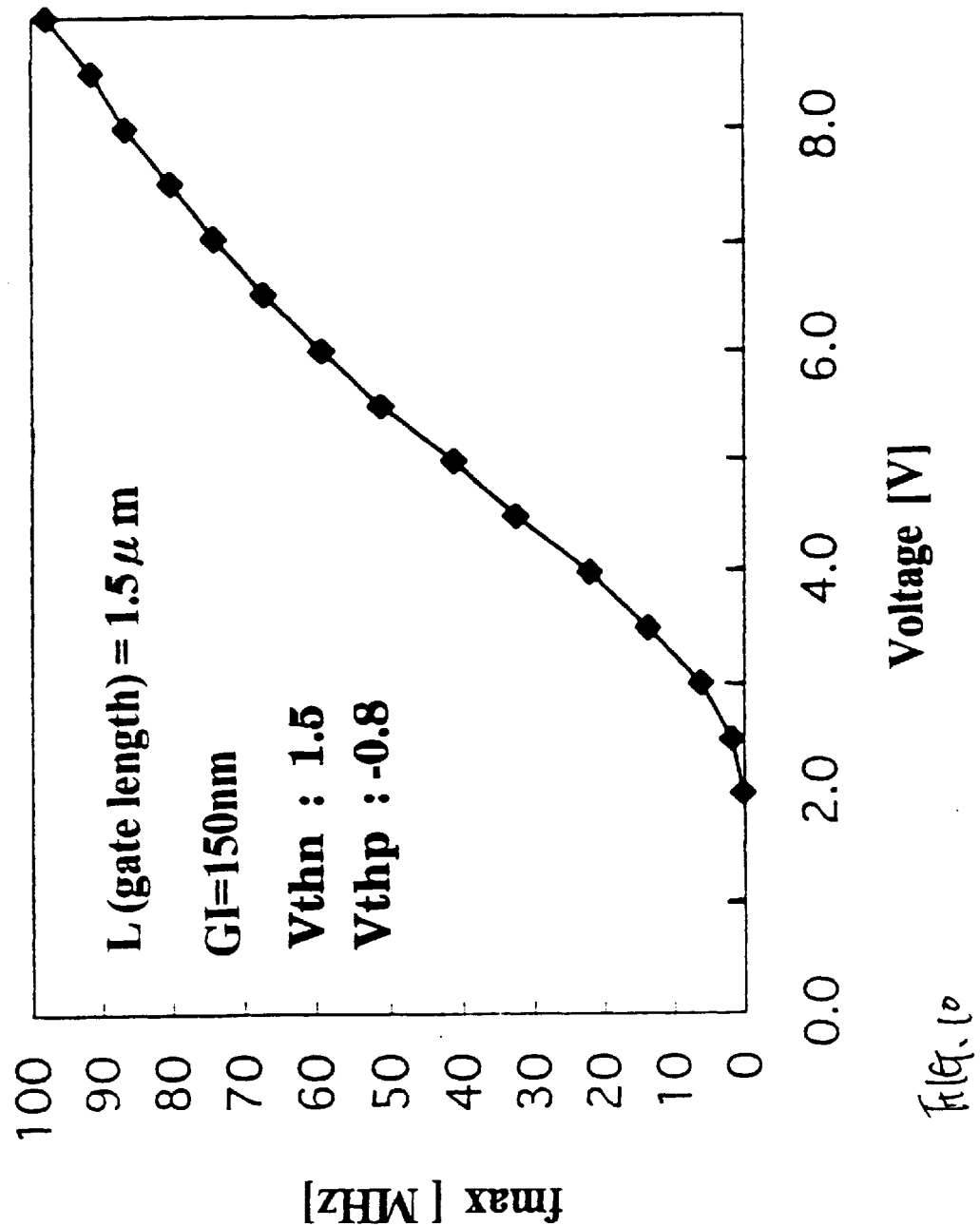

Next, reference is made to FIGS. 9 and 10. Shown in FIGS. 9 and 10 are characteristics in operating frequency of the shift resister 1011 when the liquid crystal display device of active matrix type is manufactured by the fabricating method in accordance with the present invention. FIG. 9 takes up the case where the channel length of each of the P channel type TFT and N channel type TFT is 4 $\mu$m, which constitutes the shift resister 1011, while FIG. 10 takes up the case of 1.5 $\mu$m.

FIG. 9 indicates that the shift resister operates at about 0.5 MHz at the maximum when the applied voltage is 3V. If the applied voltage is 4V, it operates at about 2 MHz at the maximum; when 5V, about 5 MHz at the maximum; when 6V, about 9 MHz at the maximum; when 7V, about 11 MHz at the maximum; when 8V, about 13 MHz at the maximum; when 9V, about 16 MHz at the maximum.

FIG. 10 teaches that the shift resister operates at about 20 and several MHz at the maximum when the applied voltage is 4V. If the applied voltage is 5V, it operates at about 40 and several MHz at the maximum; when 6V, about 60 and several MHz at the maximum; when 7V, about 70 and several MHz at the maximum; when 8V, about 80 and several MHz at the maximum; when 8.5V, nearly 100 MHz at the maximum. Therefore, the drawings persuasively shows that high speed drive is realized with the liquid crystal display device of active matrix type manufactured by the fabricating method in accordance with the present invention.

Figure 11:
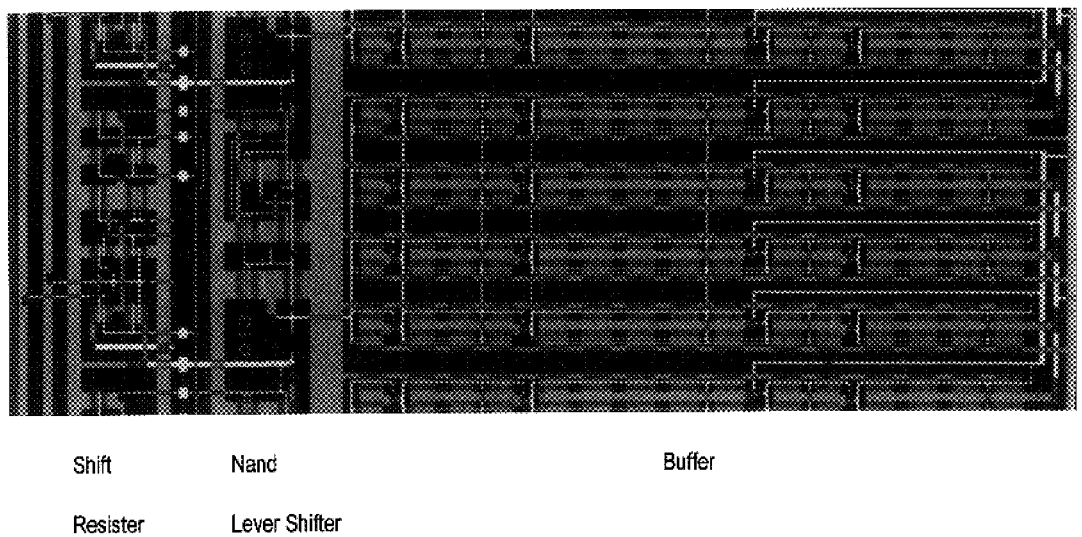
FIG. 11 is a view showing a pattern of a data line driver circuit in the liquid crystal display device of active matrix type according to Embodiment 1 of the semiconductor display device of the present invention.

FIG. 11 is a photograph showing a pattern of the data line driver circuit 101 in the liquid crystal display device of active matrix type of this embodiment. It can be understood that the shift resister 1011, NAND circuit, the level shifter 1012 and the buffer 1013 are formed.

Figure 12:
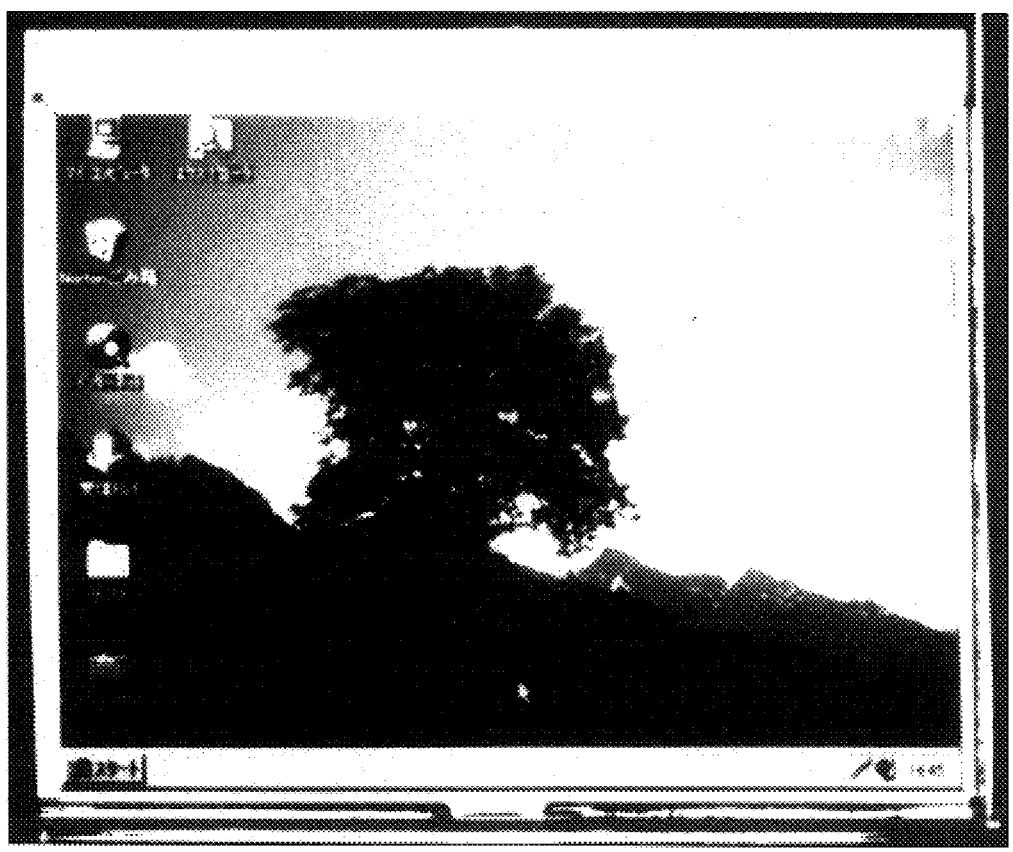
FIG. 12 is a view showing an example of display by the liquid crystal display device of active matrix type according to Embodiment 1 of the semiconductor display device of the present invention.

FIG. 12 shows an example of display by the liquid crystal display device of active matrix type of this embodiment. Despite the fact that the invention is a liquid crystal display device of active matrix type as small as 4.5 inch, high resolution that equals to VGA standard is attained.

The power consumption of the liquid crystal display device of active matrix type manufactured by the fabricating method in accordance with the present invention is 39.9 mW, which is about a half of the power consumption in a conventional liquid crystal display device of active matrix type (one sixth of a liquid crystal display device of active matrix type using amorphous silicon).

Consequently, the liquid crystal display device of active matrix type of this embodiment realizes, in spite of its smallness, high definition/high resolution/high image quality and is capable of greatly reducing the power consumption as compared with conventional devices.

Embodiment 2

This embodiment is based on the fabricating method of Embodiment 1. Here, in the step of FIG. 3D, the mask will be removed and laser will be irradiated to activate phosphorus in the active layer.

Excimer laser with which a large output can be obtained is used for the laser irradiation. The excimer laser is one that has beam processed into a linear shape to accelerate processing speed. To be concrete, the laser irradiation is performed onto the whole surface of the substrate by forming, with KrF excimer laser and a predetermined lens group, laser beam having a width of 0.5 mm and a length of 12 cm, and by scanning the beam to the substrate in the width direction of the linear beam while facing to the substrate.

The same effect is found to be obtained when other kind of excimer laser, XeCl excimer laser for example, is used. Also when laser beam that is not processed into a linear shape is used, the same effect is obtained. The sheet resistance of phosphorus thus activated is about 2 K$\Omega$/□.

The rest of the process is the same as in Embodiment 1.

According to the fabricating method of this embodiment, capability of catalytic element, Nickel, etc., in gettering is improved and enhanced by electric energy of activated phosphorus. In addition, nickel is on the other hand in a state where gettering of nickel is easier because nickel is diffused as nickel silicide in the film on receiving the energy that activates phosphorus.

Embodiment 3

In this embodiment, a process will be described in which the laser irradiation step shown in FIG. 2 for improving gettering performance is replaced by RTA.

RTA is an abbreviation for Rapid Thermal Annealing. In RTA, a light source, typical example of which is a halogen lamp, of intense light mainly emits infrared light to heat only the film formed on the surface of the substrate in a short period of time.

Substrate itself, however, is also heated a little, for RTA cannot reduce a time required for heating to as short as the time laser takes, wave length region of RTA mainly resides in the infrared region (while excimer laser light is ultraviolet light), and so on.

Accordingly, RTA has difficulty in applying the film high energy as compared with laser, but can perform more uniform annealing than laser because of its energy superior in stableness to the laser energy. In addition, RTA has an ability to sufficiently apply to the active layers an energy required in this embodiment.

RTA used in this embodiment is one having a halogen lamp. RTA used in this embodiment has a beam of light processed into a linear shape, which increases processing efficiency. Almost the same processing method as the method using linear laser is employed in RTA. RTA, however, takes rather long time to process unlike laser, so that the substrate, being unable to stand the rapid change in temperature, may sometimes break. Therefore it is required to raise the substrate temperature prior to the treatment.

The substrate is previously heated to 350° C., in this embodiment, then the halogen lamp scans and irradiates the substrate in similar way to laser.

The same effect is found to be obtained when the halogen lamp is replaced by an arc lamp. In addition, the beam of light in RTA is not necessarily be processed into a linear shape. In this embodiment, the fabricating method shown in Embodiment 1 is repeated except that the laser irradiation step is replaced by RTA, and a film is obtained which has a sheet resistance of 5 k$\Omega$/□. The rest of the process is conducted after Embodiment 1. The TFTs fabricated by the method shown in this embodiment have the substantially same characteristics as that of the TFTs obtained in Example 1.

Embodiment 4

By the above fabricating methods of Examples 1 to 3, the liquid crystal display device of active matrix type according to the present invention is fabricated with top gate type TFTs. However, the liquid crystal display device of active matrix type according to the present invention may be consisted of bottom gate type, for example, inverted stagger type TFTs.

Embodiment 5

In the above Embodiments 1 to 4, as the display mode of the liquid crystal display device of active matrix type according to the present invention, TN mode using nematic liquid crystal is employed. Alternatively, mode utilizing field control birefringence, polymer distribution mode that uses a mixed layer of the liquid crystal and polymer, or the like may be employed.

In the active matrix type liquid crystal display device fabricated by the above Embodiments 1 to 4, various liquid crystal materials other than twisted nematic liquid crystal, may be used. For example, the liquid crystal materials disclosed in "Characteristics and Driving Scheme of Polymer-Stabilized Monostable FLCD Exhibiting Fast Response Time and High Contrast Ratio with Gray-Scale Capability" by H. Furue et al. in SID 1998, "A Full-Color Thresholdless Antiferroelectric LCD Exhibiting Wide Viewing Angle with Fast Response Time" by T. Yoshida et al, in 1997 SID DIGEST, 841, J. Mater. Chem. 6(4), 671–673, 1996 by S. Inui et al., or U.S. Pat. No. 5,594,569, may be used. The entire disclosures of these articles and U.S. Patent are incorporated herein by reference.

Further, the liquid crystal display device of active matrix type according to the present invention may also be consisted of thresholdless antiferroelectric liquid crystal which is quick in response speed.

A liquid crystal material which shows antiferroelectric phase in a temperature range is called an antiferroelectric liquid crystal material. In mixture liquid crystal material including the antiferroelectric liquid crystal material, one called thresholdless antiferroelectric mixture liquid crystal material shows an electro-optical response characteristics which a transmittivity thereof continuously varies in accordance with an electric field. It is found the thresholdless antiferroelectric mixture liquid crystal material shows V-shape electro-optical response characteristics. It is also found a driving voltage thereof is about ±2.5V (at a cell thickness of about 1–2 $\mu$m).

Figure 14:
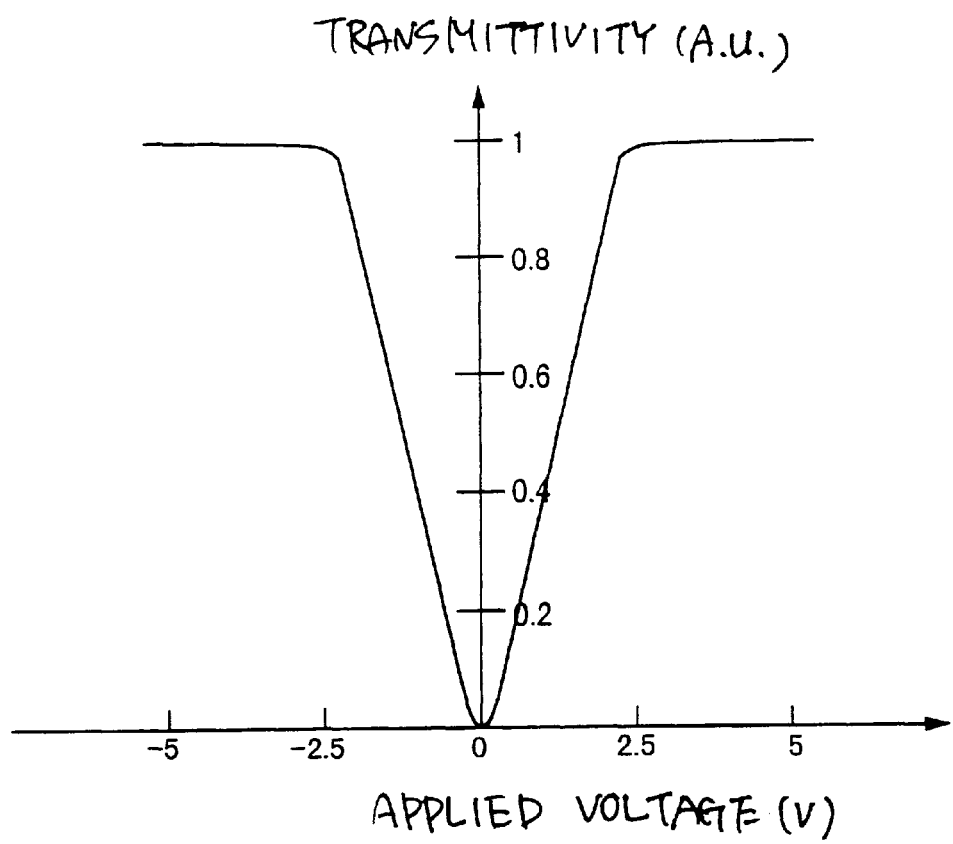
FIG. 14 is a graph showing characteristics of the threshold-less antiferroelectric mixture liquid crystal material having the V-shape electro-optical response.

FIG. 14 shows an example of the characteristics of the thresholdless antiferroelectric mixture liquid crystal material having the V-shape electro-optical response. In FIG. 14, an ordinate corresponds to a transmittivity (arbitrary unit) while an abscissa corresponds to an applied voltage. A transmission axis of a polarizing plate in an incident side of the liquid crystal display device is set to be substantially parallel with a normal direction of a smectic layer of the thresholdless antiferroelectric mixture liquid crystal material, which is substantially equal to a rubbing direction of the liquid crystal display device. Further, a transmission axis of a polarizing plate in outgoing side is set to be substantially perpendicular to the transmission axis of the polarizing plate in the incident side (Cross Nicol).

As shown in FIG. 14, using such the thresholdless antiferroelectric mixture liquid crystal material, both a low voltage driving and a gradation display can be realized.

In a case that such the thresholdless antiferroelectric mixture liquid crystal material with the low voltage driving is utilized in the liquid crystal display device including an analog driver, it is possible to suppress a power voltage of a sampling circuit for an image signal, e.g., in a range of 5 to 8 V. That is, a driving power voltage of a driver can be decreased so that a low power consumption and a high reliability for the liquid crystal display device can be realized.

In a case that such the thresholdless antiferroelectric mixture liquid crystal material with the low voltage driving is utilized in the liquid crystal display device including a digital driver, it is possible to suppress an output voltage of a D/A conversion circuit. Accordingly, a driving power voltage of the D/A conversion circuit can be reduced so that a driving power voltage of a driver can be decreased. That is, a low power consumption and a high reliability for the liquid crystal display device can be realized.

Therefore, it is also effective to use such the thresholdless antiferroelectric mixture liquid crystal material with the low voltage driving in a case that a thin film transistor (TFT) which includes LDD regions (low concentration regions) having a relatively small width (for example, 0 to 500 nm, or 0 to 200 nm) is utilized.

Meantime, in general, the thresholdless antiferroelectric mixture liquid crystal material has a large spontaneous polarization. Further, the liquid crystal itself has a high a dielectric constant. As a result, when the thresholdless antiferroelectric mixture liquid crystal material is used in a liquid crystal display device, relatively large storage capacitors are necessary in pixels. Therefore, it is proper to employ a thresholdless antiferroelectric mixture liquid crystal material with a small spontaneous polarization. In addition, with a line sequential driving method for the liquid crystal display device, it is possible to make writing time of a gradation voltage into the pixels (pixel feed period) long. Thus, even though the storage capacitors are small, it can be compensated thereby.

Because the thresholdless antiferroelectric mixture liquid crystal material can realize the low voltage driving, the low power consumption of the liquid crystal display device can be realized.

Furthermore, any liquid crystal material having the electro-optical characteristics as shown in FIG. 14 can be utilized in the active matrix type liquid crystal display device of the present invention.

Also for a semiconductor display device according to the present invention, any display medium may be used so long as the optical characteristic can be modulated in response to applied voltage. Electroluminescence device for instance, may be used.

Embodiment 6

CMOS circuits and pixel active matrix circuits produced by the Embodiments 1–5 of the present invention can be applied to not only an active matrix type liquid crystal display, but also a plurality of electro-optical devices (e.g. an active matrix type EL display, and an active matrix type EC display). That is, the present invention can be carried out for all the electric apparatus including such the electro-optical devices as display media.

As such electronic apparatus, a video camera, a digital camera, a head mount display (a goggle type display), a car navigation system, a personal computer, a portable information terminal (mobile computer, portable telephone, electric book, etc.) and the like are enumerated. Examples of those are shown in FIG. 13A to 13F.

Figure 13A:
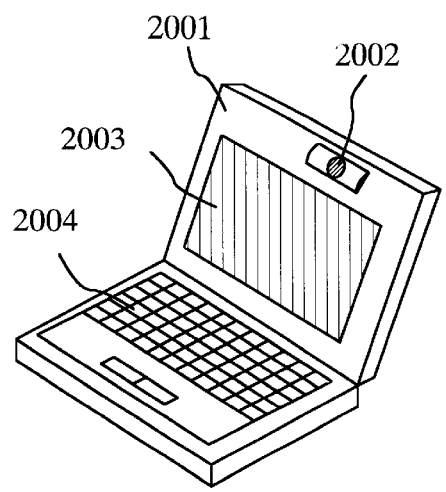
FIGS. 13A to 13F are views each showing an example of a semiconductor device that utilizes a semiconductor display device according to Embodiment 6 of the present invention.

FIG. 13A shows a personal computer which is constituted by a main body 2001, an image input portion 2002, a display device 2003, and a keyboard 2004. The present invention can be applied to the image input portion 2002, the display device 2003, and other signal control circuits.

Figure 13B:
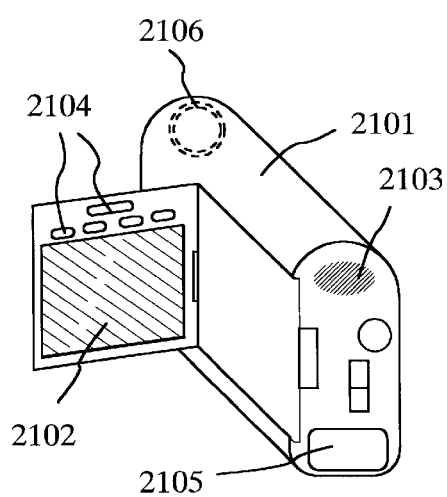

FIG. 13B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, and other signal control circuits.

Figure 13C:
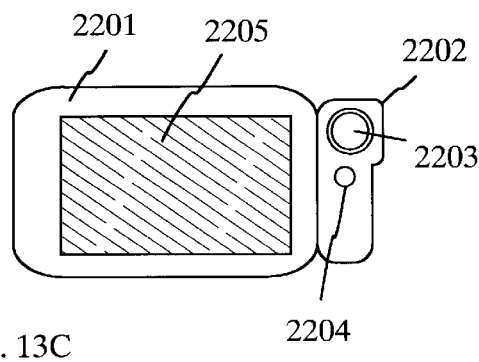

FIG. 13C shows a mobile computer which is constituted by a main body 2201, a camera portion 2202, an image receiving portion 2203, an operation switch 2204, and a display device 2205. The present invention can be applied to the display device 2205 and other signal control circuits.

Figure 13D:
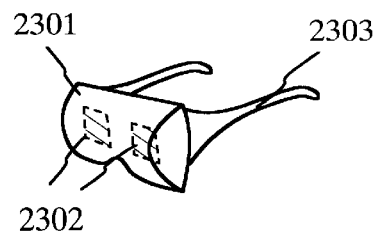

FIG. 13D shows a goggle type display which is constituted by a main body 2301, a display device 2302, and an arm portion 2303. The present invention can be applied to the display device 2302 and other signal control circuits.

Figure 13E:
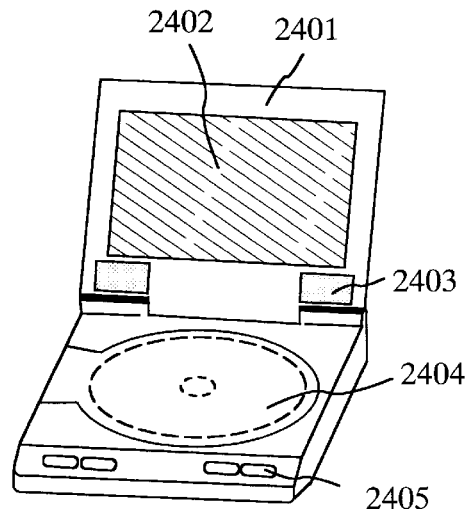

FIG. 13E shows a player apparatus which is equipped with a recording medium for recording a program (hereinafter, called "a recording medium"). The player apparatus is constituted by a main body 2401, a display device 2402, a speaker portion 2403, a recording medium 2404, an operation switch 2405 and an eternal input portion 2406. This apparatus includes a DVD (digital Versatile Disc), a CD and the like as the recording medium for appreciating music and movie, playing a game, and Internet. The present invention can be applied to the display device 2402 and other signal control circuits.

Figure 13F:
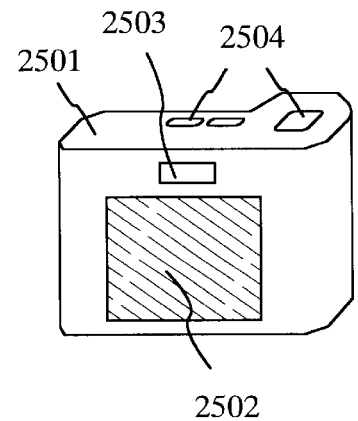

FIG. 13F shows a digital camera which is constituted by a main boy 2501, a display device 2502, an eyepiece portion 2503, an operation switch 2504 and an image receiving portion (not shown). The present invention can be applied to the display device 2502 and other signal control circuits.

As described above, the present invention can be applied in a large range, so that it is possible to apply to any electric apparatus in every field. In addition, the electric apparatus in the instant invention can be realized by using any structure combined with Embodiments 1–5.

According to the present invention, there is provided a semiconductor display device with high definition/high resolution/high image quality in spite of its small size. Also attained is the power consumption of quite a small value as compared with the power consumption in conventional devices.

What is claimed is:

1. A method of manufacturing a semiconductor device comprising the steps of:

forming a semiconductor film over a substrate;

crystallizing the semiconductor film by using a material for promoting crystallization;

selectively adding a gettering element in the semiconductor film;

annealing the semiconductor film by RTA after adding the gettering element; and gettering the material for promoting crystallization from a part of the semiconductor film not having the gettering element added into a part of the semiconductor film having the gettering element added by heat treatment after annealing the semiconductor film by RTA.

2. A method of manufacturing a semiconductor film comprising the steps of:

forming a semiconductor film over a substrate;

crystallizing the semiconductor film by using a material for promoting crystallization;

adding a gettering element in the semiconductor film;

annealing the semiconductor film by RTA after adding the gettering element; and gettering the material for promoting crystallization from the semiconductor film after annealing the semiconductor film by RTA.

3. A method of manufacturing a semiconductor device comprising the steps:

forming a semiconductor film over a substrate;

crystallizing the semiconductor film by using a material for promoting crystallization;

irradiating the semiconductor film with a laser for improving crystallinity;

selectively adding a gettering element in the semiconductor film;

annealing the semiconductor film by RTA after adding the gettering element; and gettering the material for promoting crystallization from a part of the semiconductor film not having the gettering element added into a part of the semiconductor film having the gettering element added by heat treatment after annealing the semiconductor film by RTA.

4. A method of manufacturing a semiconductor device comprising the steps of:

forming a semiconductor film over a substrate;

crystallizing the semiconductor film by using a material for promoting crystallization;

irradiating the semiconductor film with a laser for improving crystallinity;

adding a gettering element in the semiconductor film;

annealing the semiconductor film by RTA after adding the gettering element; and gettering the material for promoting crystallization from the semiconductor film after annealing the semiconductor film by RTA.

5. A method of manufacturing a semiconductor device comprising the steps of:

forming a semiconductor film over a substrate;

crystallizing the semiconductor film by using a material for promoting crystallization;

selectively adding a gettering element in the semiconductor film;

irradiating the semiconductor film with a laser after adding the gettering element; and gettering the material for promoting crystallization from a part of the semiconductor film not having the gettering element added into a part of the semiconductor film having the gettering element added by heat treatment after irradiating the semiconductor film with a laser.

6. A method of manufacturing a semiconductor device comprising the steps of:
forming a semiconductor film over a substrate;
crystallizing the semiconductor film by using a material for promoting crystallization;
adding a gettering element in the semiconductor film;
irradiating the semiconductor film with a laser after adding the gettering element; and
gettering the material for promoting crystallization from the semiconductor film after irradiating the semiconductor film with a laser.

7. A method of manufacturing a semiconductor device comprising the steps of:
forming a semiconductor film over a substrate;
crystallizing the semiconductor film by using a material for promoting crystallization;
irradiating the semiconductor film with a laser for improving crystallinity;
selectively adding a gettering element in the semiconductor film;
irradiating the semiconductor film with a laser after adding the gettering element; and
gettering the material for promoting crystallization from a part of the semiconductor film not having the gettering element added into a part of the semiconductor film having the gettering element added by heat treatment after irradiating the semiconductor film with a laser.

8. A method of manufacturing a semiconductor device comprising the steps of:
forming a semiconductor film over a substrate;
crystallizing the semiconductor film by using a material for promoting crystallization;
irradiating the semiconductor film with a laser for improving crystallinity;
adding a gettering element in the semiconductor film;
irradiating the semiconductor film with a laser after adding the gettering element; and
gettering the material for promoting crystallization from the semiconductor film after irradiating the semiconductor film with a laser.

9. A method of manufacturing a semiconductor device according to claim 1, wherein the material for promoting crystallization comprises at least one selected from the group consisting of Ni, Fe, Co, Ru, Rh, Pd, Os, Ir, Pt, Cu and Au.

10. A method of manufacturing a semiconductor device according to claim 2, wherein the catalytic element comprises at least one selected from the group consisting of Ni, Fe, Co, Ru, Rh, Pd, Os, Ir, Pt, Cu and Au.

11. A method of manufacturing a semiconductor device according to claim 3, wherein the material for promoting crystallization comprises at least one selected from the group consisting of Ni, Fe, Co, Ru, Rh, Pd, Os, Ir, Pt, Cu and Au.

12. A method of manufacturing a semiconductor device according to claim 4, wherein the material for promoting crystallization comprises at least one selected from the group consisting of Ni, Fe, Co, Ru, Rh, Pd, Os, Ir, Pt, Cu and Au.

13. A method of manufacturing a semiconductor device according to claim 5, wherein the material for promoting crystallization comprises at least one selected from the group consisting of Ni, Fe, Co, Ru, Rh, Pd, Os, Ir, Pt, Cu and Au.

14. A method of manufacturing a semiconductor device according to claim 6, wherein the material for promoting crystallization comprises at least one selected from the group consisting of Ni, Fe, Co, Ru, Rh, Pd, Os, Ir, Pt, Cu and Au.

15. A method of manufacturing a semiconductor device according to claim 7, wherein the material for promoting crystallization comprises at least one selected from the group consisting of Ni, Fe, Co, Ru, Rh, Pd, Os, Ir, Pt, Cu and Au.

16. A method of manufacturing a semiconductor device according to claim 8, wherein the material for promoting crystallization comprises at least one selected from the group consisting of Ni, Fe, Co, Ru, Rh, Pd, Os, Ir, Pt, Cu and Au.

17. A method of manufacturing a semiconductor device according to claim 1, wherein the gettering element comprises at least one selected from the group consisting of P, N, As, Sb and Bi.

18. A method of manufacturing a semiconductor device according to claim 2, wherein the gettering element comprises at least one selected from the group consisting of P, N, As, Sb and Bi.

19. A method of manufacturing a semiconductor device according to claim 3, wherein the gettering element comprises at least one selected from the group consisting of P, N, As, Sb and Bi.

20. A method of manufacturing a semiconductor device according to claim 4, wherein the gettering element comprises at least one selected from the group consisting of P, N, As, Sb and Bi.

21. A method of manufacturing a semiconductor device according to claim 5, wherein the gettering element comprises at least one selected from the group consisting of P, N, As, Sb and Bi.

22. A method of manufacturing a semiconductor device according to claim 6, wherein the gettering element comprises at least one selected from the group consisting of P, N, As, Sb and Bi.

23. A method of manufacturing a semiconductor device according to claim 7, wherein the gettering clement comprises at least one selected from the group consisting of P, N, As, Sb and Bi.

24. A method of manufacturing a semiconductor device according to claim 8, wherein the gettering element comprises at least one selected from the group consisting of P, N, As, Sb and Bi.

25. A method of manufacturing a semiconductor device according to claim 1, wherein the semiconductor device is a device selected from the group consisting of a video camera, a digital camera, a head mount display, a car navigation system, a personal computer and a portable information terminal.

26. A method of manufacturing a semiconductor device according to claim 2, wherein the semiconductor device is a device selected from the group consisting of a video camera, a digital camera, a head mount display, a car navigation system, a personal computer and a portable information terminal.

27. A method of manufacturing a semiconductor device according to claim 3, wherein the semiconductor device is a device selected from the group consisting of a video camera, a digital camera, a head mount display, a car navigation system, a personal computer and a portable information terminal.

28. A method of manufacturing a semiconductor device according to claim 4, wherein the semiconductor device is a device selected from the group consisting of a video camera, a digital camera, a head mount display, a car navigation system, a personal computer and a portable information terminal.

29. A method of manufacturing a semiconductor device according to claim 5, wherein the semiconductor device is a device selected from the group consisting of a video camera, a digital camera, a head mount display, a car navigation system, a personal computer and a portable information terminal.

30. A method of manufacturing a semiconductor device according to claim 6, wherein the semiconductor device is a device selected from the group consisting of a video camera, a digital camera, a head mount display, a car navigation system, a personal computer and a portable information terminal.

31. A method of manufacturing a semiconductor device according to claim 7, wherein the semiconductor device is a device selected from the group consisting of a video camera, a digital camera, a head mount display, a car navigation system, a personal computer and a portable information terminal.

32. A method of manufacturing a semiconductor device according to claim 8, wherein the semiconductor device is a device selected from the group consisting of a video camera, a digital camera, a head mount display, a car navigation system, a personal computer and a portable information terminal.

33. A method of manufacturing a semiconductor device comprising the steps of:
   forming a semiconductor film over a substrate;
   crystallizing the semiconductor film by using a material for promoting crystallization;
   providing the semiconductor film with a material for gettering after the crystallizing step;
   annealing the semiconductor film by RTA after providing the material for gettering; and
   gettering the material for promoting crystallization from the semiconductor film by heat treatment after the annealing step after annealing the semiconductor film by RTA.

34. A method of manufacturing a semiconductor device comprising the steps of:
   forming a semiconductor film over a substrate;
   crystallizing the semiconductor film by using a material for promoting crystallization;
   providing the semiconductor film with a material for gettering after the crystallizing step;
   irradiating the semiconductor film with a laser after providing the material for gettering; and
   gettering the material for promoting crystallization from the semiconductor film by heat treatment after the annealing step after irradiating the semiconductor film with a laser.

35. A method of manufacturing a semiconductor device according to claim 33, wherein the semiconductor device is a device selected from the group consisting of a video camera, a digital camera, a head mount display, a car navigation system, a personal computer and a portable information terminal.

36. A method of manufacturing a semiconductor device according to claim 34, wherein the semiconductor device is a device selected from the group consisting of a video camera, a digital camera, a head mount display, a car navigation system, a personal computer and a portable information terminal.

37. A method of manufacturing a semiconductor device according to claim 33, wherein the material for promoting crystallization comprises at least one selected from the group consisting of Ni, Fe, Co, Ru, Rh, Pd, Os, Ir, Pt, Cu and Au.

38. A method of manufacturing a semiconductor device according to claim 34, wherein the material for promoting crystallization comprises at least one selected from the group consisting of Ni, Fe, Co, Ru, Rh, Pd, Os, Ir, Pt, Cu and Au.

* * * * *